United States Patent
Lin (10) Patent No.: US 6,710,735 B1
(45) Date of Patent: Mar. 23, 2004

(54) DUAL SUPPLY VOLTAGE PIPELINED ADC

(75) Inventor: Chia-Liang Lin, Union City, CA (US)

(73) Assignee: Realter Semiconductor Corp., Hsinchu (TW)

( * ) Notice: Subject to any disclaimer, the term of this patent is extended or adjusted under 35 U.S.C. 154(b) by 0 days.

(21) Appl. No.: 10/464,718

(22) Filed: Jun. 17, 2003

(51) Int. Cl.⁷ .............................................. H03M 1/38
(52) U.S. Cl. ...................... 341/161; 341/155; 341/144
(58) Field of Search ................................ 341/144, 155, 341/161

(56) References Cited

U.S. PATENT DOCUMENTS

| | | | | |
|---|---|---|---|---|
| 4,593,268 A | * | 6/1986 | Blauschild | 341/118 |
| 5,966,088 A | * | 10/1999 | Matsumoto et al. | 341/156 |
| 6,169,502 B1 | * | 1/2001 | Johnson et al. | 341/120 |
| 6,366,230 B1 | * | 4/2002 | Zhang et al. | 341/162 |
| 6,456,223 B1 | * | 9/2002 | Yu et al. | 341/161 |

* cited by examiner

*Primary Examiner*—Peguy JeanPierre
(74) *Attorney, Agent, or Firm*—Daniel J. Bedell; Smith-Hill and Bedell (57) ABSTRACT

An analog-to-digital converter (ADC) includes N stages implemented within a single integrated circuit and connected in series to form a pipeline. The first stage of the pipeline receives the analog signal as its input, and each of the first N–1 stages of the pipeline supplies an analog residue signal as input to a next succeeding stage of the pipeline. Each stage includes an amplifier for amplifying its input signal to produce a sample voltage stored in an internal sampling capacitor and generates output data indicating an approximate magnitude of its stored sample voltage. The magnitude of the analog residue signal produced by each stage indicates a difference between the voltage represented by that stage's output data and its sample voltage. The amplifiers of the first N-M stages of the pipeline are powered by a higher supply voltage than the amplifiers of the last M stages of the pipeline to maximize the sample voltages in the first N-M stages, thereby reducing the influence of thermal noise on the sample voltages in those stages.

17 Claims, 3 Drawing Sheets

DUAL SUPPLY VOLTAGE PIPELINED ADC

BACKGROUND OF THE INVENTION

1. Field of the Invention

The present invention relates in general to pipelined analog-to-digital converters (ADCs), and in particular to a pipelined ADC having a dual supply voltage.

2. Description of Related Art

A typical digital communication transmitter encodes a data sequence to produce a waveform data sequence defining an analog signal. The transmitter then converts the waveform data sequence into the analog signal and transmits it to a receiver. An analog-to-digital converter (ADC) within the receiver periodically digitizes the analog signal to produce a waveform data sequence representing successive voltage levels of the analog signal. Digital signal processing circuits then process the waveform data sequence to recover the original data sequence. In a digital communication system operating at high data rates, the receiver must employ a high resolution ADC that can sample the analog signal at a high frequency. For example, a very high speed broadband access digital subscriber loop (VDSL) offering downstream data rates up to 52 Mbps needs an ADC providing 12 effective bits of resolution at a sample rate of 35 MHZ.

A pipelined ADC employing a sequence of low-resolution ADC stages to digitize an analog signal with high resolution is well suited for high-speed, high-resolution applications. The following U.S. patents incorporated herein by reference describe various pipelined ADC architectures:

U.S. Pat. No. 6,169,502, issued Jan. 2, 2001 to Johnson et al.,

U.S. Pat. No. 6,366,230, issued Apr. 2, 2002 to Zhang et al., and

U.S. Pat. No. 6,456,223, issued Sep. 24, 2002 to Yu et al.

Figure 1:
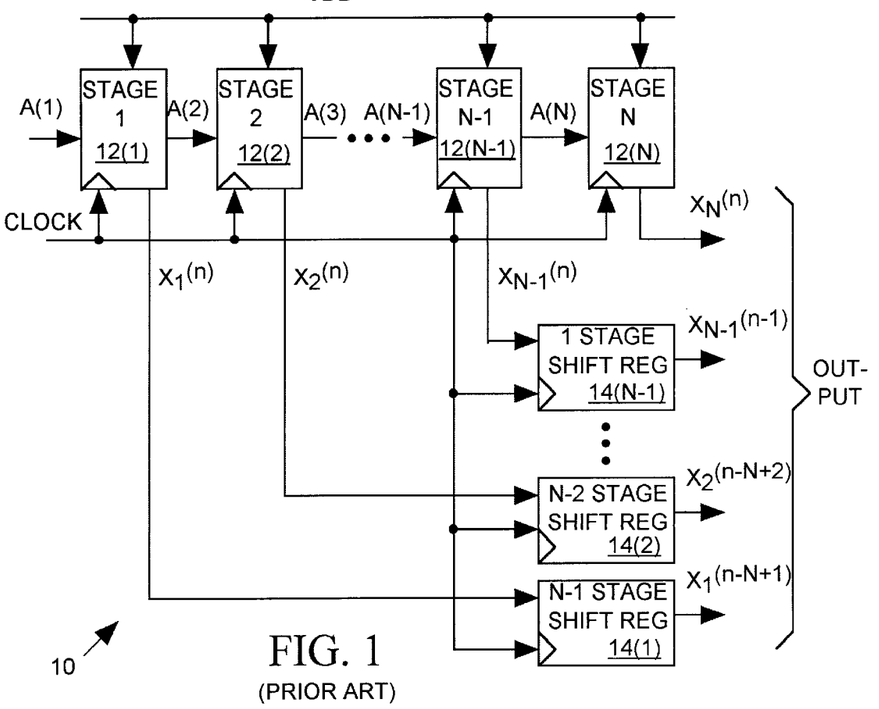
FIG. 1 depicts a prior art pipelined analog-to-digital converter (ADC) in block diagram form.

FIG. 1 illustrates a typical prior art pipelined ADC 10 including a set of N ADC stages 12(1)–12(N) and a set of N−1 shift registers 14(1)–(N−1). A differential analog signal A(1) to be digitized is applied as input to the first stage 12(1). In response to each $n^{th}$ leading (or trailing) edge of a clock signal (CLOCK), each $i^{th}$ stage 12(i) samples the voltage of its analog input signal A(i) and produces a B-bit data word $x_i^{(n)}$ approximating the magnitude of the sampled input signal voltage with B-bit resolution. Each $i^{th}$ stage 12(i) other than the last stage 12(N) also supplies an output differential analog residue signal A(i+1) as an input signal to the next stage 12(i+1) wherein $$A(i+1)=2^B[A(i)-(VMAX/2^B)(x_i^{(n)}-2^{B-1}+½)]$$

where VMAX is the peak-to-pak full range voltage of the stage's differential input signal A(i). The output residue signal A(i+1) of each $i^{th}$ stage 12(i) is thus proportional to the error difference between the sampled voltage of its input signal A(i) and the voltage level represented by the stage output data $x_i^{(n)}$.

For example a pipelined DAC for which B=2, VMAX=5 volts, and N=3 stages could digitize an input signal A(1) ranging from −2.5V to 2.5V with BxN=6-bit resolution. With B=2, each $i^{th}$ data word $x_i^{(n)}$ can have any of four 2-bit values representing −1.875, −0.625 or 1.875 volts. Thus when A(1) is, for example, 0.4 volts when sampled on an $n^{th}$ CLOCK signal pulse, the first stage output data is $$x_1^{(n)}=10(binary)$$

representing a magnitude of 0.625 volts which approximates the actual 0.4 volt magnitude of the A(1) signal. The stage 1 output residue signal A(2) will be $$A(2)=2^2[0.4-(⅝)(2-1.5)]=2^2[0.4-0.625]=-0.9 \text{ volts}$$

On the $(n+1)^{th}$ CLOCK signal edge, second stage 12(2) will digitize the −0.9 volt A(2) signal to produce output data $$x_2^{(n-1)}=01(binary)$$

corresponding to a magnitude of −0.625 volts approximating the −0.9 volt A(2) signal. The second state output analog signal A(3) has magnitude $$A(3)=2^2[-0.9-(⅝)(1-1.5)]=2^2[-0.9+0.625]=-1.1 \text{ volts.}$$

On the $(n+2)^{th}$ CLOCK signal edge, the final pipeline stage 12(3) will digitize the 1.4 volt A(3) signal to produce output data $$x_3^{(n+2)}=01(binary)$$

corresponding to a measured value of −0.625 volts.

Successive stages 12(1)–12(N) produce their output data $x_1^{(n)}-x_N^{(n)}$ with progressively larger delays. Therefore shift registers 14(1)–14(N−1) delay successive stage output data by progressively decreasing delays so that they concurrently produce output data $x_1^{(n-N+1)}-x_N^{(n)}$ that can be combined to form a single NxB-bit OUTPUT word representing the magnitude of the A(1) input signal when sampled by stage 12(1) N CLOCK signal cycles earlier. In the example case the ADC's digital OUTPUT word value will be $$OUTPUT=\{X_3^{(n)}, X_2^{(n-N+2)}, X_1^{(n-N+1)}\}=100101(binary)=37(decimal)$$

The OUTPUT word value, which can range from 0 to $2^6-1$, represents the sampled magnitude of input signal A(1) with 6-bit resolution. In this example the OUTPUT word represents an input signal voltage $$A(1)=(VMAX/2^6)\times(OUTPUT-2^5+½)=(⁵⁄₆₄)5.5=0.429 \text{ volts}$$

which is as close to the actual 0.4 volts of ADC input signal A(1) as can be represented given a −2.5 to 2.5 volt range and 6-bit resolution.

Figure 2:
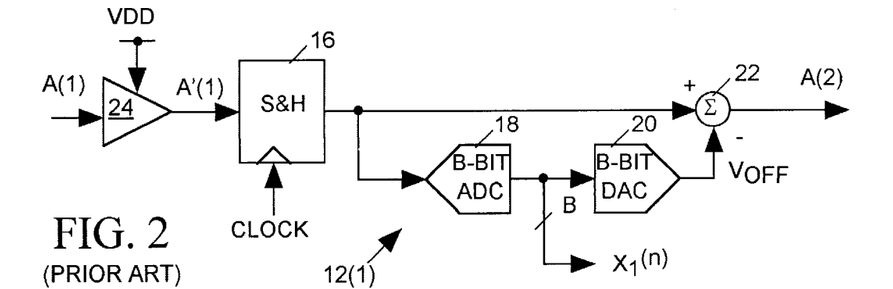
FIG. 2 depicts a single stage of the prior art ADC of FIG. 1 in more detailed block diagram form.

FIG. 2 illustrates an example architecture for stage 12(1) of the pipelined ADC of FIG. 1. Stages 12(2)–12(N−1) are similar. An amplifier 24 amplifies the differential A(1) signal to produce sample voltage A' (1). A sample and hold (S/H) circuit 16 samples and holds A' (1) on each leading or trailing edge of the CLOCK signal and the sample voltage A' (1) stored in S&H circuit 16 is supplied to a B-bit ADC 18. ADC digitizes A' (1) to produce B-bit output data $x_1^{(n)}$. A B-bit digital-to-analog converter (ADC) 20 converts $x_1^{(n)}$ into an offset voltage $$V_{OFF}=(VMAX/2^B)(x_1^{(n)}-2^{B-1}+½).$$

An analog summing amplifier 22 offsets A' (1) by $V_{OFF}$ to produce the differential stage output residue signal A(2).

Figure 3:
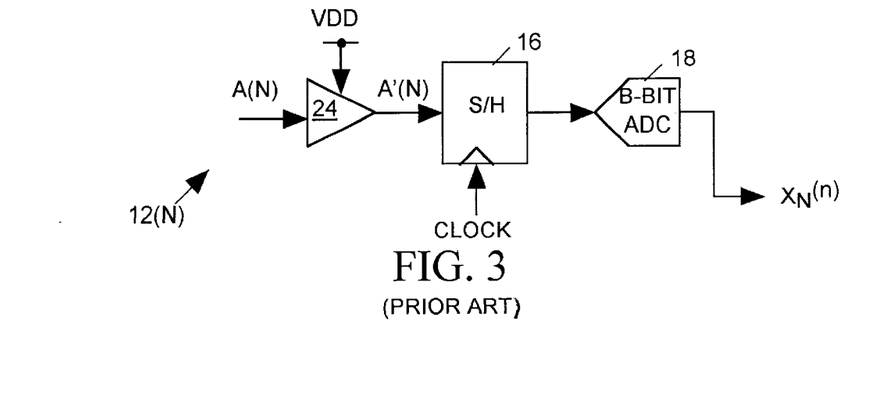
FIG. 3 depicts a last stage of the prior art ADC of FIG. 1 in more detailed block diagram form.

FIG. 3 depicts an example of final stage 12(N) of FIG. 1 that is similar to stage 12(1) of FIG. 2 except that it omits DAC and summing amplifier 22.

Error Sources

Various factors can compromise the accuracy of the pipelined ADC 10 of FIGS. 1–3 including, for example:

1. thermal noise,
2. comparator offset error within the ADC 18 of any stage, 3. error in the gain of amplifier 24 of any stage,
4. nonlinearity of ADC 18,
5. nonlinearity of DAC 20,
6. nonlinearity of amplifier 24, and
7. incomplete settling of output residue signal A(2).

Among the above sources of error, only thermal noise is random and varies from sample-to-sample. The other sources of error, mainly mismatches in circuit elements such as transistor dimensions, resistor and capacitor values, are "systematic" in that they are consistent from sample-to-sample. Many correction and calibration techniques are available to significantly improve the accuracy of ADCs by compensating for systematic errors. For example it is possible to substantially reduce systematic errors by adjusting the gain and offset of the amplifier 24 in one or more stages. Thus the accuracy of modern pipelined ADCs is typically limited by thermal noise rather than by systematic errors.

In response to each leading or trailing edge of the CLOCK signal, S&H circuit 16 briefly connects the sample voltage A' (1) signal to an internal capacitor so that amplifier 24 producing the A' (1) signal can charge the capacitor to the current A' (1) signal voltage. The capacitor voltage remains at the sampled signal A' (1) voltage for the remainder of the CLOCK cycle to allow the A(2) and $X_1^{(n)}$ stage outputs time to settle to new levels.

The sampling capacitor actually remains only approximately at the sampled signal A' (1) voltage during the remainder of the CLOCK cycle because thermal noise tends to make the sample voltage A' (1) vary with time. In a pipelined ADC properly calibrated to compensate for systematic error, the variation in sample voltage A' (1) due to thermal noise can be the most significant source of error in the ADC's output data. Circuit designers often refer to this source of thermal noise as "KT/C noise" because the thermal noise power in the A' (1) signal is proportional to KT/C, where K is the Boltzmann's constant ($1.38 \times 10^{-23}$ Joules/° K.), where T is the temperature of the S&H circuit in degrees Kelvin, and where C is the capacitance of the sampling capacitor.

Since thermal noise is proportional to KT/C, we can decrease thermal noise power in any ADC stage by increasing the magnitude of the sampling capacitance C within S&H circuit 16. But increasing C also has undesirable effects. When S&H circuit 16 is to sample the A' (1) signal at a high frequency, amplifier 24 must be able to charge it quickly. When we increase sampling capacitance C, amplifier 24 needs more time to charge the sampling capacitance thereby reducing the maximum sampling frequency at which the S&H circuit can operate.

One way to compensate for the reduction in sampling frequency resulting from an increase in sampling capacitance is to increase the ability of the charging amplifier 24 to supply more charging current to the sampling capacitance so that it can charge it more quickly. The charging amplifier 24 includes one or more output transistors for coupling the sampling capacitor to a voltage source VDD when briefly turned on at the start of each CLOCK signal cycle. Since the impedance of those transistors limits the magnitude of the current, we can increase the amount of charging current amplifier 24 supplies to the sampling capacitor by increasing the number of its output transistors and/or by increasing the channel widths of its output transistors, thereby reducing transistor impedance. Thus when it is necessary to increase the size of the sampling capacitor in any stage 12(1)–12(N) to reduce thermal noise power, designers know to also increase the number or channel widths of output transistors in the amplifier 24 supplying current to the sampling capacitor to avoid reducing the ADC's maximum allowable sampling frequency.

But when we increase the number and/or channel widths of transistors in an ADC stage, we also increase the area of an IC die occupied by that stage as well as the stage's power consumption.

Tapered Pipelined ADCs

Since the output data $x_i(n)$ generated by each stage provides less significant bits of the ADC OUTPUT word than its preceding stage, an error in output data of each successive stage has a lower impact on the accuracy of the ADC OUTPUT word than an error in the output data of its preceding stage. For example consider a pipelined ADC having N=3 stages, having B=4 bit resolution per stage, and having a differential input signal voltage ranging from −VMAX/2 to +VMAX/2 volts, wherein thermal noise in each stage can be sufficiently large to occasionally cause an error in the least significant bit in the stage data output. Since the resolution of the first stage is VMAX/16, thermal noise in the first stage output data can cause the value of the pipelined ADC OUTPUT word to vary by as much as VMAX/16. Since the resolution of the second stage is VMAX/256, the thermal noise error in the second stage output data can cause the OUTPUT word of the pipelined ADC to vary only by a maximum of VMAX/256. A 1-bit thermal noise error in the third stage output data can cause the OUTPUT word of the pipelined ADC to vary only by as much as VMAX/4096. Thus while increasing the sampling capacitance of the S&H circuit of the first stage of a pipelined ADC can greatly reduce the error in the ADC's OUTPUT word arising from thermal noise, increasing sampling capacitance of subsequent stages reduces thermal noise error by progressively smaller amounts.

Figure 4:
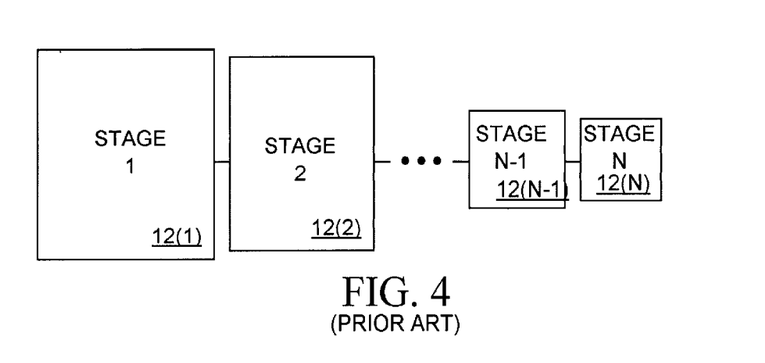
FIG. 4 is a simplified plan view of a prior art tapered pipelined ADC.

Accordingly successive stages of many pipelined ADCs employ progressively smaller sampling capacitors requiring amplifiers of progressively lower current output to supply them with charging current. Since amplifiers capable of providing smaller charging currents require less floor space than amplifiers capable of producing larger charging currents, successive stages of such a "tapered" pipelined ADC occupy progressively smaller floor space as illustrated in FIG. 4. They also consume progressively smaller amounts of power.

CMOS Device Scalability

Complementary Metal Oxide Semiconductor (CMOS) technology has dominated the semiconductor industry for decades due mainly to two characteristics of CMOS devices: zero static power dissipation, and scalability. A zero static power dissipation device dissipates very little power except when it changes state. In a digital circuit employing synchronous logic, state changes occur only at the start of each clock cycle, and a CMOS IC therefore has a relatively low average power consumption rate compared to most other types of ICs.

The "scalability" of CMOS devices relates to the fact that we can make CMOS devices forming a circuit smaller without changing the basic function of the circuit. If we reduce the dimensions (width, length, and thickness) of a CMOS transistor by α%, and if we also reduce the supply voltage, threshold voltage and doping levels by α%, then the current through the transistors and its capacitance will be reduced by α%, though the electric field characteristics within the transistor will remain unchanged. The switching speed of a CMOS inverter, a fundamental building block of CMOS logic, is proportional to I/CV, where I is the current, C is the channel capacitance of the transistors forming the inverter, and V is the inverter's supply voltage. When we scale down the channel dimensions and doping levels of transistors forming a CMOS inverter, for example by 50%, we reduce I, C and V each by 50%, thereby doubling the speed of the inverter and allowing it to operate at twice the frequency. Also since current and voltage levels are each reduced by 50%, the CMOS device's power consumption, which is proportional to the product of its current and voltage levels, is reduced by a factor of four. Thus by scaling down a CMOS device we allow it to achieve higher device density and speed while dissipating substantially less power. In the past decade, CMOS technology has been scaled down from minimum channel lengths of 0.5 $\mu$m to 0.13 $\mu$m, resulting in a supply voltage reduction from 5V to 1.2V and in increased performance and decreased costs.

While scaling down CMOS devices has many advantages with respect to digital circuits, it may have some distinct disadvantages with respect to analog circuits. When we reduce the supply voltage of an analog circuit to accommodate scaled down transistor dimensions, we limit the maximum allowable voltage swing of the analog signal the circuit can process, and that has an adverse effect of the circuit's dynamic range. "Dynamic range" is a commonly employed figure of merit for an analog circuit representing a ratio between the highest signal voltage signal that the circuit can handle and the smallest signal voltage that the circuit can resolve. A circuit's supply voltage limits the highest signal voltage an analog circuit can handle and thermal noise limits the lowest signal voltage an analog circuit can resolve. When we scale down the transistors forming an analog circuit by $\alpha$%, thereby decreasing its supply voltage by $\alpha$%, then the amplitude of the highest signal voltage it can handle is reduced by $\alpha$%. But since thermal noise remains unchanged, the amplitude of the lowest signal voltage the circuit can resolve remains unchanged. The circuit's dynamic range is therefore reduced by $\alpha$%.

Therefore to avoid a reduction in a circuit's dynamic range after scaling down an ADC pipeline design, a designer reduces thermal noise power by increasing sampling capacitance, and then increases the size and/or number of transistors in the charging amplifiers the stages to avoid a reduction in operating frequency. However, in general for pipelined ADC stages of comparable dynamic range and operating frequency, power consumption and floor space is lower for ADC's implemented by transistors having longer channel lengths operating at a higher supply voltages than for ADC's implemented by transistors having shorter channel lengths operating at a lower supply voltages because ADCs operating at the lower voltages need more transistors and larger capacitors. Thus while scaling down transistors in a digital circuit can decrease floor space and power consumption, scaling down transistors in an analog circuit such as a pipelined ADC can increase power consumption and floor space when the circuit's level of performance is to be preserved.

When an IC such as an ADC converter includes both analog and digital circuits, the disadvantages of scaling down and IC's analog circuits to some extent offsets the advantages of scaling down the IC's digital circuits. One approach to maintaining analog circuit performance when digital circuits are scaled down is to implement the analog and digital circuits in separate ICs so that the analog circuits need not be scaled down with the digital circuits. But this solution increases board size, package size, bill of material costs, and parts count. Since the advantages of scaling digital circuits are so overwhelming, and since the advantages of integrating both digital and analog circuits in the same chip are compelling, with further reductions in CMOS channel widths on the horizon, circuit designers will find maintaining analog circuit performance will be a continuing challenge.

BRIEF SUMMARY OF THE INVENTION

The invention relates to a pipelined analog-to-digital converter (ADC) for processing an analog input signal to produce a sequence of digital output word (OUTPUT) representing successive magnitudes of the input signal sampled in response to successive leading (or trailing) edges of a clock signal.

The ADC includes a set of N stages connected in series to form a pipeline wherein a first stage of the pipeline receives the analog input signal as its stage input signal, and wherein each of the first N–1 stages of the pipeline generates and supplies an analog residue signal as an input signal to a next succeeding stage of the pipeline. Each stage includes an amplifier for amplifying the stage input signal to produce a sample voltage and includes a sample and hold circuit for charging its sampling capacitance to the sample voltage in response to each of a succession of clock signal edges. Each stage also includes a low resolution DAC for producing digital stage output data representing an approximate magnitude of the sample voltage, and circuits for driving the stage's analog output residue signal to a voltage proportional to a difference between the magnitudes of the sample voltage and that stage's output data. Shift registers delay the output data of each stage by an appropriate number of clock cycles so that the output data of all stages can combine to form a succession of high resolution digital representations of successive samples of their analog input signal voltage.

All pipeline stages are implemented within a single integrated circuit, but the charging amplifiers within the first M stages operate with a higher supply voltage than charging amplifiers within the last N-M stages and employ transistors having larger minimum channel lengths capable of operating at the larger supply voltage. For example the amplifiers in the first M stages could be implemented using 0.35 $\mu$m technology CMOS transistors capable of operating at 3.3 V while amplifiers in the last N-M stages could be implemented employing either 0.13 $\mu$m or 0.18 $\mu$m technology CMOS transistors operating at 1.2V or 1.8V, respectively.

The higher supply voltages of the charging amplifiers of the first M stages allow them to charge the stage's sampling capacitance over a wider voltage range. The thermal noise power of a stage is a function of the stage's sampling capacitance and is independent of the charging voltage, so increasing the range of a stage's charging voltage does not reduce the thermal noise power generated in the stage's sampling capacitance. But increasing the range of the charging voltage reduces the effects of a given level of thermal noise power on the stage's output data by making thermal noise a smaller percentage of the sample voltage. Thus increasing supply voltage in the first M stages to permit increased sample voltage range decreases the effects of thermal noise on the output data those stages.

Although the first M stages must employ transistors having larger minimum channel lengths to accommodate the increased supply voltage, the total amount of IC die area occupied by each of the first M stages and the amount of power they consume is less than would be required were the first M stages to employ the same lower supply voltages and smaller channel length transistors as the last N-M stages, since more transistors and larger capacitors would be needed to achieve a similar level of noise immunity. The charging amplifiers in last N-M stages of the pipeline can operate at a lower supply voltage because with thermal noise power in those stages having a lesser effect on digitization accuracy, it is preferable in terms in terms of minimizing stage size and power consumption to employ smaller channel length transistors operating at the lower supply voltage.

While a CMOS IC implementing a pipelined ADC in accordance with the invention requires two different power supply voltages and two different CMOS transistor technology sizes, many CMOS manufacturing processes currently permit this. For example IC manufacturing processes implementing either 0.13 $\mu$m CMOS technology or 0.18 $\mu$m CMOS technology ICs typically permit the same ICs to also include 0.35 $\mu$m technology CMOS transistors in their I/O circuits operating at higher supply voltages to allow the ICs to communicate with external circuits through higher voltage signals. Thus since many ICs already incorporate two CMOS technologies and require two different supply voltages, the invention can be implemented without requiring any changes to currently available IC manufacturing processes and without increasing the number of different supply voltages such ICs already require.

The value of M, the number of stages employing the larger transistors and higher supply voltage, is a matter of design choice and is suitably selected to minimize a weighted combination of total power consumption and circuit area needed to provide a desired level of thermal noise immunity.

The claims appended to this specification particularly point out and distinctly claim the subject matter of the invention. However those skilled in the art will best understand both the organization and method of operation of what the applicant(s) consider to be the best mode(s) of practicing the invention, together with further advantages and objects of the invention, by reading the remaining portions of the specification in view of the accompanying drawing(s) wherein like reference characters refer to like elements.

DETAILED DESCRIPTION OF THE INVENTION

The invention relates to a pipelined analog-to-digital converter (ADC). While the specification below describes an exemplary embodiment of the invention considered to be a best mode of practicing the invention, those of skill in the art will understand that the invention is not limited to the exemplary embodiment described below or to the manner in which the exemplary embodiment operates.

Figure 5:
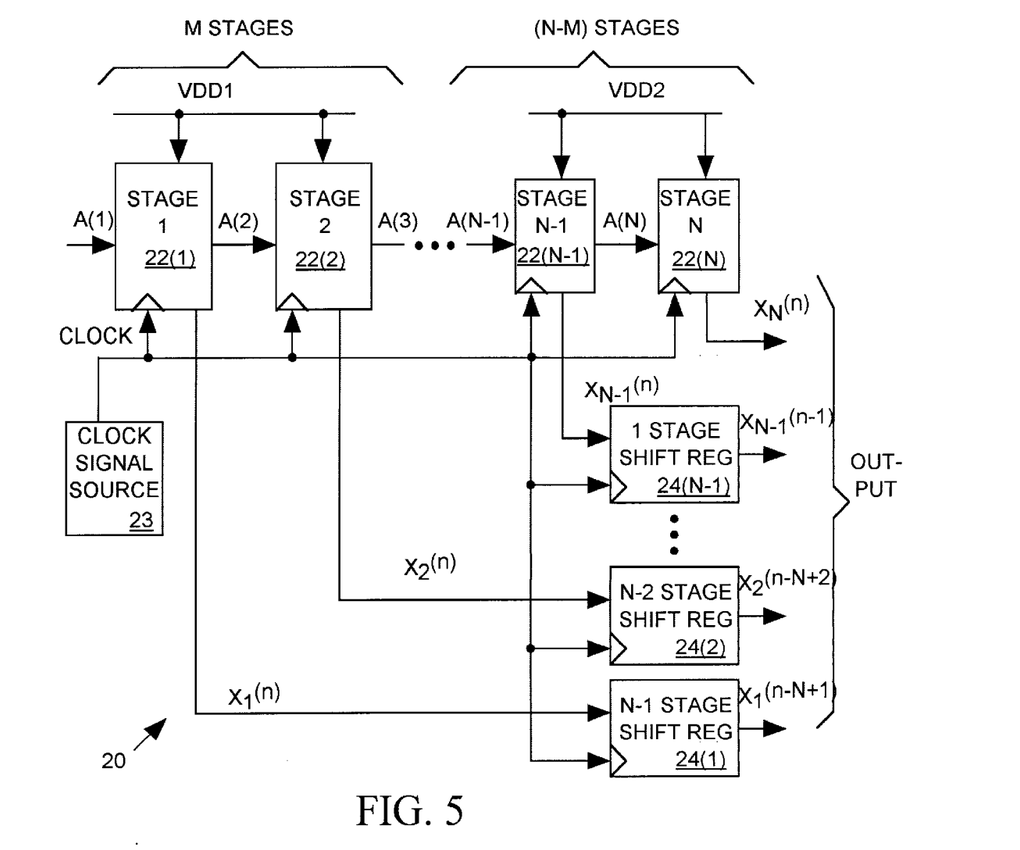
FIG. 5 depicts pipelined analog-to-digital converter (ADC) in accordance with the invention in block diagram form.

FIG. 5 depicts an example ADC 20 in accordance with the invention including a sequence of N ADC stages 22(1)–22 (N) and a set of N−1 shift registers 24(1)–24(N−1) for converting an analog differential input signal A(1) into a sequence of digital OUTPUT words representing the differential A(1) signal voltage on successive leading or trailing edges of a clock signal (CLOCK) generated by a clock signal source 23. Stages 22(1)–22(N) form a pipeline wherein the analog input signal A(1) to be digitized provides an input to first stage 22(1), and wherein each $i^{th}$ stage 22(i) other than last stage 22(N) processes its analog input signal A(i) to produce an analog residue signal A(i+1) supplied as the input signal to the next stage.

Each stage 22(i) amplifies its differential input signal A(i) to generate a sample voltage A' (i) for charging internal sampling capacitance on each edge of the CLOCK signal. Each stage 22(i) also produces a B-bit data word $X_i^{(n)}$ approximating the magnitude of the sample voltage with B-bit resolution, where B may be any integer B>0. Each $i^{th}$ stage 22(i) other than last stage 22(N) supplies an output differential residue signal A(i+1) as input to its succeeding stage 22(i+1) of magnitude $$A(i+1)=A'(i)-(VMAX/2^B)(x_i^{(n)}-2^{B-1}+\tfrac{1}{2})$$

where VMAX is the maximum peak-to-peak amplitude of sample voltage A' (i). Circuits within each $i^{th}$ stage set its output residue voltage A(i+1) magnitude to reflect a difference between the magnitude of A' (i) and the analog voltage level represented by data word $x_i^{(n)}$.

Shift registers 24(1)–24(N−1) delay successive the digital output data of stages 22(1)–22(N−1) by progressively decreasing delays so that they concurrently produce a set of output data $x_1^{(n-N+1)}$–$x_N^{(n)}$ that combine to form a single N*B-bit binary OUTPUT word on successive edges of the CLOCK signal representing the magnitude of the A(1) signal (and therefore VIN) N CLOCK signal cycles earlier:

$$OUTPUT=\{x_N^{(n)}, x_{N-1}^{(n-1)}, \ldots, x_2^{(n-N+2)}, x_1^{(n-N+1)}\}$$

Figure 6:
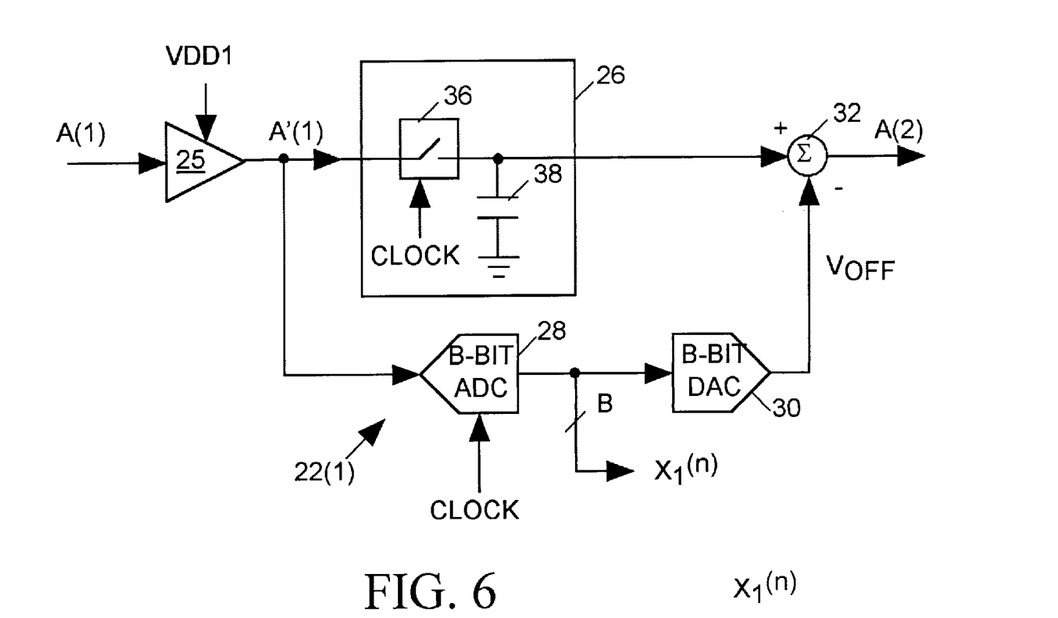
FIG. 6 depicts a single stage of the art ADC of FIG. 5 in more detailed block diagram form.

FIG. 6 illustrates stage 22(1) of pipelined ADC 20 of FIG. 5 in more detail; stages 22(2)–22(M) are similar. An amplifier 25 supplied by VDD1 amplifies A(1) by a factor of $2^B$ to produce sample voltage A' (1). A sample and hold (S/H) circuit 26 samples analog input signal A(1) on each nth leading or trailing edge of the CLOCK signal to produce a sample voltage A' (1) supplied to a summing amplifier 32. A B-bit ADC 28 digitizes the sample voltage A' (1) on each edge of the CLOCK signal to produce low resolution B-bit output data $x_1^{(n)}$ representing the magnitude of the sample voltage of A' (1). A B-bit, digital-to-analog converter (ADC) 30 converts $x_1(n)$ into an offset voltage $V_{OFF}=(VMAX/2^B)$ $(x_1^{(n)}-2^{B-1}\ \tfrac{1}{2})$ supplied to an inverting input of summing amplifier 32. Summing amplifier 32 offsets A' (1) by $V_{OFF}$ to produce the differential stage output residue signal A(2).

Stages 22(M+1) through 22(N−1) are similar in topology to amplifier 12(1) of FIG. 6 but in accordance with the invention their input amplifiers 25 are powered by a lower supply voltage VDD2. The gain of the input amplifiers 20 of stages 22(M+2) through 22(N−1) is also $2^B$, but the gain of the input amplifier 20 of stage 22(M+1) is somewhat lower than $2^B$ to compensate for the difference in supply voltages VDD1 and VDD2 supplied to the two sets of stages.

Figure 7:
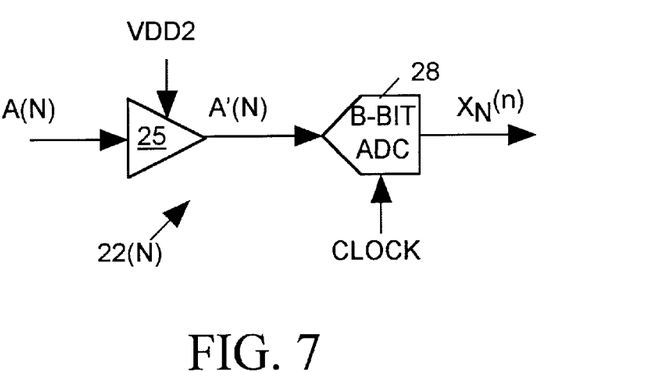
FIG. 7 depicts a last stage of the prior art ADC of FIG. 5 in more detailed block diagram form.

FIG. 7 depicts an example of final stage 22(N) of FIG. 5 including an amplifier 25 supplied by VDD2, and an B-bit ADC 28 for digitizing A' (N) to produce stage output data $x_N^{(n)}$.

The conventional S&H circuit 26 of FIG. 6 includes a sampling switch 36 and a capacitor 38. Switch 36 briefly connects the output of amplifier 25 A' (1) to sampling capacitor 38 on each leading (or trailing) edge of the CLOCK signal so that amplifier 25 can charge capacitor 38 to the current sample voltage A' (1). Capacitor 38 holds the sampled voltage for the remainder of the CLOCK signal cycle, a time sufficient to allow the residue signal A(2) produced by summing amplifier 32 to settle to its steady state level. Although the sample voltage A' (1) nominally remains at the sampled A(1) signal voltage until the next sample, thermal noise will cause the A' (1) to vary somewhat with time. The thermal noise power in A' (1) is proportional to KT/C, where K is the Boltzmann's constant ($1.38 \times 10^{-23}$ Joules/° K.), where T is the absolute temperature in degrees Kelvin, and where C is the capacitance of sampling capacitor 38. Note that the thermal noise power is independent of the voltage to which capacitor 38 may be charged.

Thermal noise in the sampling capacitor 38 in each $i^{th}$ pipeline stage 22(i) can cause an error in sample voltage A' (1) stored by the capacitor that varies with time and that error can be reflected in the data $x_2(n)$ produced by the next stage 22(2). Since the $x_2(n)$ data output of stage 22(2) forms more significant bits of the ADCs output data than the data $x_3(n)$ produced by stage 22(3), an error in $x_2(n)$ due to thermal noise in the stage 22(1) capacitance has a greater effect (by a factor of $2^B$) on the value of the ADC OUTPUT word than a similar error in $X_3(n)$ due to thermal noise in the stage 22(2) sampling capacitance. In general the influence on the OUTPUT word of an error in the $i^{th}$ stage output data $x_i(n)$ is a decreasing function of the value of i. Thus to limit the effects of thermal noise on the output data produced by ADC 20, it more important to limit thermal noise errors in the first few (M) stages of the pipeline than in the last N-M stages.

As discussed above, those of skill in the art know to reduce thermal noise power in a stage of a pipelined ADC by increasing the magnitude of its sampling capacitance. To avoid reducing the maximum frequency at which a stage can operate when the sampling capacitance of a stage is increased, those of skill in the art also know to increase the number and/or the channel widths of output transistors in the stage input amplifier so that the amplifier can a supply a larger amount of charging current to quickly charge the large sampling capacitance within that stage. Also as discussed above, in prior art "tapered" pipelined ADCs, the sampling capacitance and the number or channel widths of transistors in the charging amplifiers in each stage are progressively decreased with each successive stage since thermal noise has a progressively smaller effect on ADC OUTPUT word with each successive stage. It is helpful to keep sampling capacitance and the number or channel widths of amplifier transistors as small as possible in the later stages to conserve die floor space and to limit power dissipation in those stages.

A pipelined ADC in accordance with the invention may also progressively reduce the sampling capacitance 38 employed in successive pipeline stages and may also employ different numbers of transistors or differing channel widths of transistors in the output amplifiers of each stage to appropriately control the magnitude of thermal noise power in each stage. However in accordance with one aspect of the invention, to reduce the effects of a given level on noise power in the first M stages of an ADC, the charging amplifiers in those first M stages are provided with larger supply voltages than the last N-M stages so that their charging voltages have a wider range.

The thermal noise power of a stage is a function of the stage's sampling capacitance and is independent of the voltage to which they are charged, so increasing the range of a stage's charging voltage does not reduce the thermal noise power generated in the stage's sampling capacitance. But increasing the range of the charging voltage in any stage reduces the effects of a given level of thermal noise power on the output data of a next stage by making thermal noise a smaller percentage of the residue signal supplied as input to the next stage.

The maximum source-drain voltage for which a transistor is rated is a function of its channel length, and since they operate at increased supply voltages, the first M stages employ transistors having larger minimum channel lengths than transistors within the last N-M stages. However the total amount of IC die area occupied by the first M stages and the amount of power they consume is less than would be required were the first M stages to employ the same lower supply voltages and smaller channel length transistors as the last N-M stages, since more transistors and larger capacitors would be needed in those stages to achieve a similar dynamic range. The charging amplifiers in last N-M stages operate at a lower supply voltage because with thermal noise power in those stages having a lesser effect on digitization error, it is preferable to employ smaller channel length transistors operating at the lower supply voltage to minimize stage floor space and power consumption For example, 0.35 $\mu$m technology CMOS transistors (i.e., transistors having minimum 0.35 $\mu$m channel lengths) may form input amplifiers of the first M stages while 18 $\mu$m technology CMOS transistors may form the input amplifiers of the last N-M stages. As illustrated in FIG. 5 stages 22(1) through 22(M) are powered by a voltage source VDD1, suitably 3.3 volts when 0.35 $\mu$m technology transistors are used in those stages. Stages 22(M+1) through 22(N) are powered by a another voltage source VDD2, suitably 1.8 volts when 0.18 $\mu$m technology transistors are used in those stages. The gain of the input amplifier 25 of stage M+1 is suitably adjusted to a magnitude less the $2^B$ gain of the input amplifiers of the other stages account for the change in supply voltage between stages 22(M) and 22(M+1).

While a CMOS IC implementing a pipelined ADC in accordance with the invention requires two different power supply voltages and two different CMOS transistor technology sizes, many CMOS manufacturing processes currently permit this. For example IC manufacturing processes implementing either 0.13 $\mu$m technology CMOS transistor ICs or 0.18 $\mu$m technology CMOS transistor ICs typically permit the same ICs to also include 0.35 $\mu$m technology CMOS transistors for example in their I/O circuits. I/O circuits can require a higher supply voltage than other circuits within an IC so that they can communicate with external circuits through higher voltage signals. Since many ICs already incorporate two CMOS technologies and require two different supply voltages, the invention can be implemented without requiring substantial modifications to currently available IC manufacturing processes and without increasing the number of different supply voltages such ICs already require.

The foregoing specification and the drawings depict an exemplary embodiment of the best mode of practicing the invention, and elements or steps of the depicted best mode exemplify the elements or steps of the invention as recited in the appended claims. But the invention as recited in the claims is not necessarily limited to the best mode descried above. Those of skill in the art will appreciate that many alternative embodiments of the invention are possible. For example the total number N of pipeline stages and the number M of pipeline stages employing the larger size transistors are matters of design choice. While the example pipelined ADC described above employs CMOS transistors of 0.35 μm and 0.13 or 0.18 μm channel widths and supply voltages of 3.3 and 1.2 or 1.8 volts, it should be understood that the invention can be practiced with transistors other than CMOS, with transistors having other combinations of channel widths and supply voltages. Also while FIGS. 6 and 7 illustrates preferred embodiments of pipeline stage architectures, many variations on pipelined ADC stage architectures are known in the art, and those of skill in the art will appreciate that the invention can be used in connection with other pipelined ADC stage architectures.

Thus the appended claims are intended to apply to any mode of practicing the invention comprising the combination of elements or steps as described in any one of the claims, including but not limited to elements or steps that are functional equivalents of the example elements or steps of the exemplary embodiment(s) of the invention depicted in the specification and drawings.

What is claimed is:

1. A pipelined analog-to-digital converter (ADC) for converting an analog signal to a succession of digital words representing successive magnitudes of the analog signal, the ADC comprising:
    a sequence of stages,
    wherein a first stage of the sequence receives said analog signal as its input signal,
    wherein each stage of the sequence subsequent to the first stage receives as its input signal an analog residue signal generated by a preceding stage of the sequence,
    wherein for each digital word of the succession, each stage of the sequence generates a sample voltage proportional to a voltage of its input signal, provides output data representing an approximate magnitude of its generated sample voltage, and provides as the input signal to a next succeeding stage of the sequence, if any, an analog residue signal of magnitude proportional to a difference between a magnitude of its generated sample voltage and the approximate magnitude represented by its output data, and
    wherein one stage of the sequence is powered by a first supply signal and a next succeeding stage of the sequence is powered by a second supply signal of voltage differing substantially from a voltage of the first supply signal.

2. The pipelined ADC in accordance with claim 1 wherein all of the stages of the sequence are implemented within a single integrated circuit.

3. The pipelined ADC in accordance with claim 1 wherein the voltage of the second supply signal is substantially lower than the voltage of the first supply signal.

4. The pipelined ADC in accordance with claim 3
    wherein the stages comprise transistors having channels, and
    wherein channels of transistors of said one stage are substantially longer than channels of transistors of said next succeeding stage of the sequence.

5. The pipelined ADC in accordance with claim 4 wherein the transistors of stages are complementary metal oxide semiconductor (CMOS) transistors.

6. The pipelined ADC in accordance with claim 4
    wherein the one stage includes a first amplifier comprising transistors and powered by a first supply voltage for amplifying the first stage's input signal to generate the one stage's sample voltage,
    wherein the next succeeding stage includes a second amplifier comprising transistors and powered by a second supply voltage for amplifying the second stage's input signal to generate the next succeeding stage's sample voltage, and
    wherein channels of the transistors of the first amplifier are substantially longer than channels of transistors of the second amplifier.

7. The pipelined ADC of claim 6
    wherein each stage of the sequence producing a residue signal includes sampling capacitance for storing that stage's sample voltage, and
    wherein the sampling capacitance included in at least one of the stages of the sequence is substantially larger than the sampling capacitance included in a next stage of the sequence.

8. The pipelined ADC in accordance with claim 7 wherein all of the stages of the sequence are implemented within a same integrated circuit.

9. The pipelined ADC in accordance with claim 3
    wherein said one stage includes a first amplifier comprising transistors and powered by the first supply signal for amplifying the one stage's input signal to produce its sample voltage, and
    wherein the said next succeeding stage of the pipeline includes a second amplifier comprising transistors and powered by the second supply signal for amplifying the second stage's input signal to produce its sample voltage.

10. The pipelined ADC in accordance with claim 9
    wherein channels of the transistors of the first amplifier are substantially longer than channels of transistors of the second amplifier.

11. The pipelined ADC in accordance with claim 1
    wherein each stage of the sequence includes an amplifier having transistors for amplifying that stage's input signal to generate that stage's sample voltage, and
    wherein an amplifier included in at least one of the stages includes more transistors than an amplifier included in a next succeeding stage of the sequence.

12. The pipelined ADC in accordance with claim 1
    wherein each stage of the sequence includes an amplifier having transistors for amplifying that stage's input signal to generate that stage's sample voltage, and
    wherein an amplifier included in at least one of the stages includes transistors having wider channels than transistors of an amplifier included in a next succeeding stage of the sequence.

13. The pipelined ADC of claim 1
    wherein each stage of the sequence preceding the last stage includes a sampling capacitance for storing that stage's sample voltage, and
    wherein the sampling capacitance included in at least one of the stages of the sequence is substantially larger than a succeeding stage of the sequence.

14. A pipelined analog-to-digital converter (ADC) for converting an analog signal to a succession of digital words representing successive magnitudes of said analog signal, the pipelined ADC comprising:
    a sequence of ADC stages, wherein a first ADC stage of the sequence receives said analog signal as its input signal, wherein each ADC stage of the sequence subsequent to the first ADC stage receives as an input signal an analog residue signal generated by a preceding ADC stage of the sequence, wherein each stage comprises:
        an amplifier for amplifying its input signal to produce an amplified input signal;

a sample and hold circuit which, for each digital word of the succession, stores a corresponding sample voltage proportional to a magnitude of the amplified input signal;

an ADC circuit which, for each digital word of the succession, provides output data forming a part of that digital word and representing an approximate magnitude of that word's corresponding sample voltage; and a residue circuit for providing an output residue signal representing a difference between a magnitude of each sample voltage stored by the sample and hold circuit and the approximate magnitude represented by the output data of the ADC circuit, wherein the amplifier of at least one stage of the sequence operates at a first supply voltage, the amplifier of at least one other stage of the sequence operates at a second supply voltage substantially lower than the first supply voltage.

15. The pipelined ADC in accordance with claim 14 wherein all of the stages of the sequence are implemented within a same integrated circuit.

16. The pipelined ADC in accordance with claim 14 wherein the amplifier in each stage comprises transistors having channels, and wherein channels of transistors of the amplifier of said at least one stage are substantially longer than channels of transistors of said at least one other stage.

17. The pipelined ADC of claim 14 wherein the sample and hold circuit of each stage includes a sampling capacitance for storing its sample voltage, and wherein the sampling capacitance included in the sample and hold circuit of at least one of the stages of the sequence is substantially larger than the sampling capacitance included in the sample and hold circuit of a succeeding stage of the sequence.

* * * * *

UNITED STATES PATENT AND TRADEMARK OFFICE
CERTIFICATE OF CORRECTION

PATENT NO. : 6,710,735 B1
DATED : March 23, 2004
INVENTOR(S) : Chia-Liang Lin It is certified that error appears in the above-identified patent and that said Letters Patent is hereby corrected as shown below:

<u>Title page,</u>
Item [73], Assignee, "Realter Semiconductor Corp." should be deleted and replaced with -- Realtek Semiconductor Corp. --.

Signed and Sealed this

Eighteenth Day of May, 2004

JON W. DUDAS
*Acting Director of the United States Patent and Trademark Office*